US010361538B2

(12) United States Patent
Sugiyama et al.

(10) Patent No.: US 10,361,538 B2
(45) Date of Patent: Jul. 23, 2019

(54) MOVABLE DIFFRACTION GRATING, METHOD OF MANUFACTURING THE SAME, AND EXTERNAL RESONATOR TYPE LASER MODULE

(71) Applicant: HAMAMATSU PHOTONICS K.K., Hamamatsu-shi, Shizuoka (JP)

(72) Inventors: Atsushi Sugiyama, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/687,637

(22) Filed: Aug. 28, 2017

(65) Prior Publication Data
US 2018/0062350 A1    Mar. 1, 2018

(30) Foreign Application Priority Data
Sep. 1, 2016    (JP) .................................. 2016-171192

(51) Int. Cl.
| | | |
|---|---|---|
| H01S 3/10 | (2006.01) | |
| H01S 5/14 | (2006.01) | |
| H01S 5/06 | (2006.01) | |
| H01S 5/12 | (2006.01) | |
| H01S 5/34 | (2006.01) | |
| H01S 3/1055 | (2006.01) | |

(52) U.S. Cl.
CPC ............ *H01S 5/141* (2013.01); *H01S 3/1055* (2013.01); *H01S 5/0607* (2013.01); *H01S 5/12* (2013.01); *H01S 5/3401* (2013.01); *H01S 2302/00* (2013.01)

(58) Field of Classification Search
CPC .......... H01S 5/141–143; H01S 5/3401; H01S 5/0607; H01S 5/12; H01S 5/0687; H01S 3/1055; H01S 3/08009; H01S 3/0812; H01S 3/086; H01S 3/137; H01S 2302/00; G02B 5/18–1895; G02B 26/106
See application file for complete search history.

(56) References Cited

U.S. PATENT DOCUMENTS

| | | | | |
|---|---|---|---|---|
| 6,502,757 B1 * | 1/2003 | Iwamoto | ................ | B82Y 10/00 |
| | | | | 235/457 |
| 7,808,650 B2 * | 10/2010 | Kon | ......................... | G01D 5/58 |
| | | | | 356/499 |
| 10,001,655 B2 * | 6/2018 | Wakabayashi | ..... | G02B 27/4227 |

(Continued)

FOREIGN PATENT DOCUMENTS

| | | | | |
|---|---|---|---|---|
| JP | 2002250891 A | * | 9/2002 | ............. G02B 26/10 |
| JP | 2002323669 A | * | 11/2002 | ............. G02B 26/10 |

(Continued)

*Primary Examiner* — Jessica S Manno
*Assistant Examiner* — Delma R Fordé
(74) *Attorney, Agent, or Firm* — Drinker Biddle & Reath LLP (57) ABSTRACT

A movable diffraction grating includes: a support portion; a movable portion swingably connected to the support portion; a coil buried in the movable portion; a magnetic field generator configured to apply a magnetic field to the coil; an insulation layer provided on a surface of the movable portion; a resin layer provided on the insulation layer and provided with a diffraction grating pattern; and a reflection layer formed of a metal and provided on the resin layer to follow the diffraction grating pattern.

5 Claims, 8 Drawing Sheets (56) References Cited

U.S. PATENT DOCUMENTS

| | | | |
|---|---|---|---|
| 2002/0113675 A1* | 8/2002 | Kato | G02B 7/1821 335/80 |
| 2004/0105139 A1* | 6/2004 | Hirose | B81B 3/0018 359/199.3 |
| 2006/0007838 A1* | 1/2006 | Nakata | G11B 7/0956 369/112.12 |
| 2012/0219022 A1* | 8/2012 | Dougakiuchi | G02B 5/1828 372/20 |
| 2012/0252111 A1* | 10/2012 | Tono | G01N 33/54373 435/288.7 |
| 2016/0105090 A1* | 4/2016 | Sadaharu | H02K 33/18 310/38 |

FOREIGN PATENT DOCUMENTS

| | | | | |
|---|---|---|---|---|
| JP | WO2015177974 A1 | * | 11/2005 | G01J 3/18 |
| JP | 5351729 B2 | | 11/2013 | |
| JP | WO2014109170 | * | 7/2014 | G02B 26/08 |
| JP | WO2016157419 A1 | * | 10/2016 | B81B 3/00 |

* cited by examiner

MOVABLE DIFFRACTION GRATING, METHOD OF MANUFACTURING THE SAME, AND EXTERNAL RESONATOR TYPE LASER MODULE

TECHNICAL FIELD

An aspect of the invention relates to a movable diffraction grating which is configured as, for example, a MEMS (Micro Electro Mechanical Systems) device, a method which manufactures the same, and an external resonator type laser module which includes the movable diffraction grating.

BACKGROUND

As a MEMS device, there is known a movable diffraction grating including a support portion, a movable portion swingably connected to the support portion, a driving portion driving the movable portion, and a metal film formed on the movable portion and provided with a diffraction grating pattern (for example, see Japanese Patent No. 5351729). In such a movable diffraction grating, for example, the movable portion is swung at a high speed at a resonance frequency level.

SUMMARY

When the above-described movable diffraction grating is used in, for example, an external resonator type laser module, the movable portion needs to be swung at a high speed with a large deflection angle. For this reason, there is a case where the movable portion needs to be decreased in thickness. Meanwhile, when the movable portion decreases in thickness, heat generated by the driving portion during the operation of the movable diffraction grating is easily transferred to the metal film. As a result, there is concern that the metal film serving as a diffraction grating may be deformed so that optical characteristics are degraded.

Here, an aspect of the invention is to provide a movable diffraction grating capable of swinging a movable portion at a high speed with a large deflection angle and suppressing degradation in optical characteristic due to a thermal deformation, a method of manufacturing the same, and an external resonator type laser module including such a movable diffraction grating.

A movable diffraction grating according to an aspect of the invention includes: a support portion; a movable portion swingably connected to the support portion; a coil buried in the movable portion; a magnetic field generator configured to apply a magnetic field to the coil; an insulation layer provided on a surface of the movable portion; a resin layer provided on the insulation layer and provided with a diffraction grating pattern; and a reflection layer formed of a metal and provided on the resin layer to follow the diffraction grating pattern.

In the movable diffraction grating, the coil is buried in the movable portion. Accordingly, it is possible to decrease the thickness of the movable portion and to swing the movable portion at a high speed with a large deflection angle. Further, because the coil is buried in the movable portion, it is possible to ensure the thickness of the coil and to decrease the resistance of the coil. When the resistance of the coil decreases, the heating of the coil is suppressed and thus the deformation of the reflection layer due to the transfer of the heat from the coil can be suppressed. Further, in the movable diffraction grating, the resin layer is provided with the diffraction grating pattern and the reflection layer formed of a metal is provided on the resin layer to follow the diffraction grating pattern. Accordingly, because the resin layer is disposed between the coil and the reflection layer, it is possible to suppress the transfer of the heat from the coil to the reflection layer and to promote the radiation of the heat from the surface opposite to the reflection layer in the movable portion. As a result, it is possible to further suppress the deformation of the reflection layer due to the transfer of the heat from the coil. Thus, according to the movable diffraction grating, it is possible to swing the movable portion at a high speed with a large deflection angle and to suppress degradation in optical characteristic due to a thermal deformation.

In the movable diffraction grating according to an aspect of the invention, the coil may be disposed inside a groove formed in the surface of the movable portion. In this case, it is possible to further decrease the thickness of the movable portion and to swing the movable portion at a higher speed with a larger deflection angle.

In the movable diffraction grating according to an aspect of the invention, the diffraction grating pattern may be disposed in an area overlapping the coil when viewed from a direction perpendicular to the surface of the movable portion. In this case, it is possible to swing the movable portion at a high speed with a large deflection angle by suppressing an increase in area of the movable portion while ensuring the area of the diffraction grating pattern.

In the movable diffraction grating according to an aspect of the invention, the diffraction grating pattern may be a blazed grating pattern which diffracts light having a wavelength in a mid-infrared region. In this case, a high diffraction efficiency can be obtained. Further, because the grooves of the blazed grating for the wavelength in the mid-infrared region are deeper than those for the wavelength shorter than in the mid-infrared region, it is possible to reduce an influence on the diffraction efficiency from the deformation of the reflection layer.

A method of manufacturing the movable diffraction grating according to an aspect of the invention is a method of manufacturing the above-described movable diffraction grating, including: a first step of preparing a substrate including a portion corresponding to the support portion and the movable portion and forming the coil to be buried in the movable portion; a second step of forming the insulation layer on the surface of the movable portion after the first step; a third step of disposing a resin material on the insulation layer after the second step; a fourth step of forming the resin layer provided with the diffraction grating pattern by transferring a transfer pattern corresponding to the diffraction pattern to the resin material using a mold having the transfer pattern after the third step; and a fifth step of forming the reflection layer on the resin layer to follow the diffraction grating pattern after the fourth step. In the method of manufacturing the movable diffraction grating, because the resin layer provided with the diffraction grating pattern is formed by transferring a transfer pattern to the resin material by using the mold having the transfer pattern corresponding to the diffraction grating pattern, the highly precise diffraction grating pattern can be easily formed.

An external resonator type laser module according to an aspect of the invention includes: the above-described movable diffraction grating; and a quantum cascade laser element, in which the movable diffraction grating diffracts and reflects light oscillated by the quantum cascade laser element so that light having a specific wavelength is returned to the quantum cascade laser element. In the external resonator type laser module, when the movable diffraction grating serves as the external resonator, light having a specific wavelength can be amplified and output to the outside. Further, when the movable portion of the movable diffraction grating is swung to change the direction of the lattice surface, the wavelength of the output light can be changed at a high speed. For that reason, for example, when the external resonator type laser module is used as a light source for gas concentration measurement, one light source can measure various gases and the measurement time can be shortened.

DETAILED DESCRIPTION

Hereinafter, an embodiment of the invention will be described in detail with reference to the drawings. In the following description, the same reference numerals will be given to the same or corresponding components and a repetitive description will be omitted.

Figure 1:
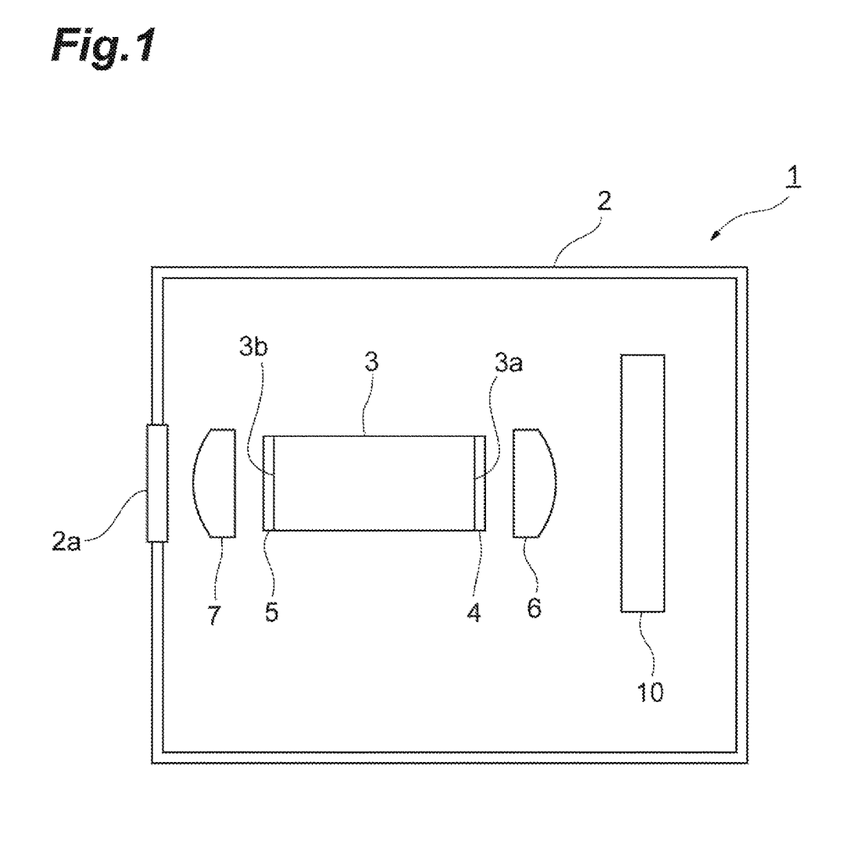
FIG. 1 is a configuration diagram of an external resonator type laser module according to an embodiment of the invention.

As shown in FIG. 1, an external resonator type laser module 1 includes a casing 2, a quantum cascade laser element 3, a reflection reduction film 4, a reflection portion 5, a lens 6, a lens 7, and a movable diffraction grating 10. The casing 2 accommodates the quantum cascade laser element 3, the reflection reduction film 4, the reflection portion 5, the lens 6, the lens 7, and the movable diffraction grating 10 therein. The casing 2 includes a window 2a for outputting output light to the outside.

The quantum cascade laser element 3 includes a first end 3a and a second end 3b which face away each other and emit light of a wide band (for example, 4 μm or more and 16 μm or less) in a mid-infrared region from each of the first end 3a and the second end 3b. The quantum cascade laser element 3 has a structure in which a plurality of active layers having different center wavelengths are stacked and can emit the above-described broadband light. The quantum cascade laser element 3 may have a structure with a single active layer. Even in this case, the quantum cascade laser element 3 can emit the above-described broadband light.

The reflection reduction film 4 is provided at the first end 3a of the quantum cascade laser element 3. The reflection reduction film 4 reduces reflectance at the time of emitting light from the first end 3a of the quantum cascade laser element 3 to the outside. Further, the reflection reduction film 4 reduces reflectance at the time of inputting light to the first end 3a of the quantum cascade laser element 3 from the outside.

The reflection portion 5 is provided at the second end 3b of the quantum cascade laser element 3. The reflection portion 5 reduces reflectance at the time of emitting light from the second end 3b of the quantum cascade laser element 3 to the outside. The reflection portion 5 reflects a part of the light emitted from the second end 3b of the quantum cascade laser element 3 and transmits the remaining portion thereof. The light transmitted through the reflection portion 5 becomes the output light of the external resonator type laser module 1. The second end 3b may not be provided with the reflection portion 5 and the second end 3b may be exposed.

The lens 6 collimates the light emitted from the first end 3a of the quantum cascade laser element 3. The lens 7 collimates the light emitted from the second end 3b of the quantum cascade laser element 3. The light which is collimated by the lens 7 is output to the outside through the window 2a of the casing 2.

The light which is collimated by the lens 6 is incident to the movable diffraction grating 10. The movable diffraction grating 10 diffracts and reflects the incident light so that light having a specific wavelength is returned to the first end 3a of the quantum cascade laser element 3. That is, the movable diffraction grating 10 and the reflection portion 5 constitute a Littrow type external resonator. Accordingly, the external resonator type laser module 1 can amplify light having a specific wavelength and output the light to the outside.

In the movable diffraction grating 10, a direction of a lattice surface can be changed at a high speed as will be described later. Accordingly, the wavelength of the light returned from the movable diffraction grating 10 to the first end 3a of the quantum cascade laser element 3 is variable. That is, the wavelength of the output light of the external resonator type laser module 1 is variable. Such an external resonator type laser module 1 is used to measure, for example, the concentration of various gases based on the absorption of light having a wavelength in a mid-infrared region.

Referring to FIGS. 2 to 5, the movable diffraction grating 10 will be further described. The movable diffraction grating 10 includes a support portion 11, a pair of connection portions 12, a movable portion 13, a coil 14, a magnetic field generator 15, an insulation layer 16, a resin layer 17, and a reflection layer 18. The movable diffraction grating 10 is configured as an MEMS device that swings the movable portion 13 about an axis X.

Figure 2:
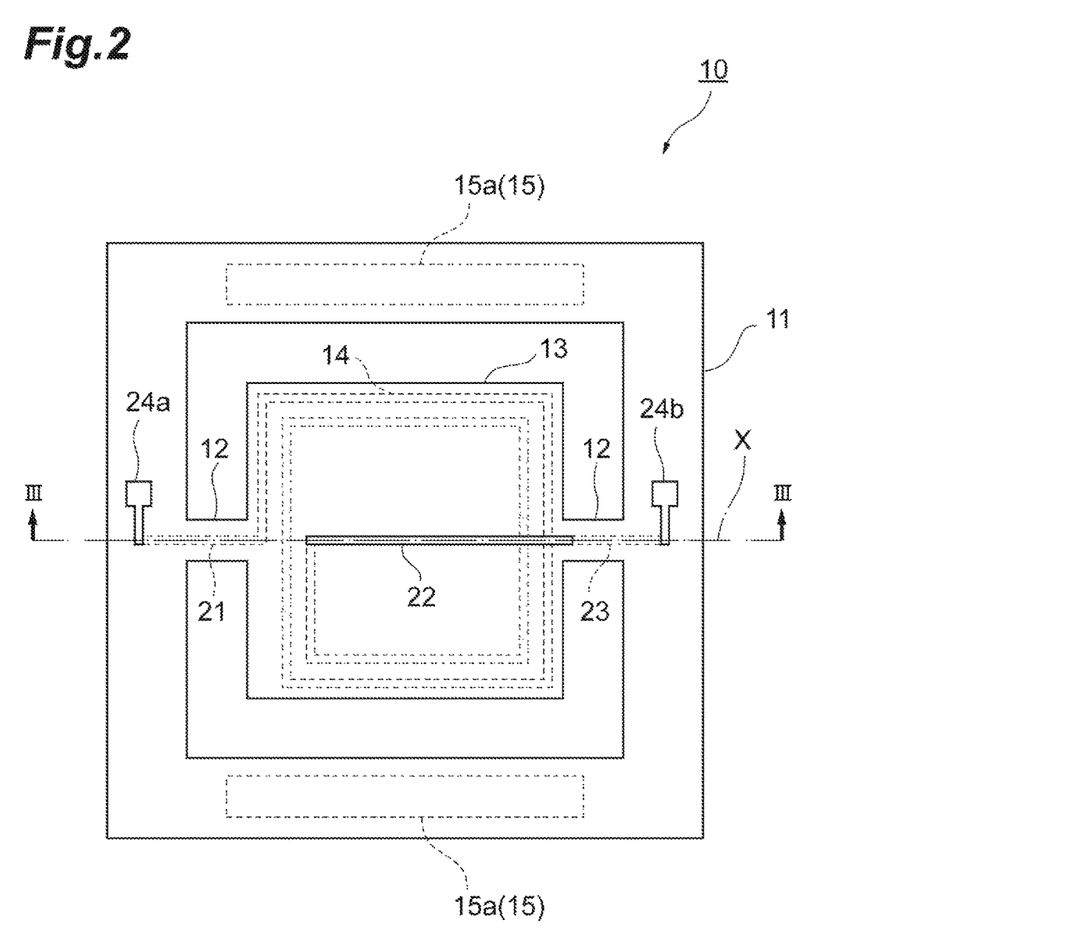
FIG. 2 is a circuit configuration diagram of a movable diffraction grating of the external resonator type laser module of FIG. 1.
Figure 3:
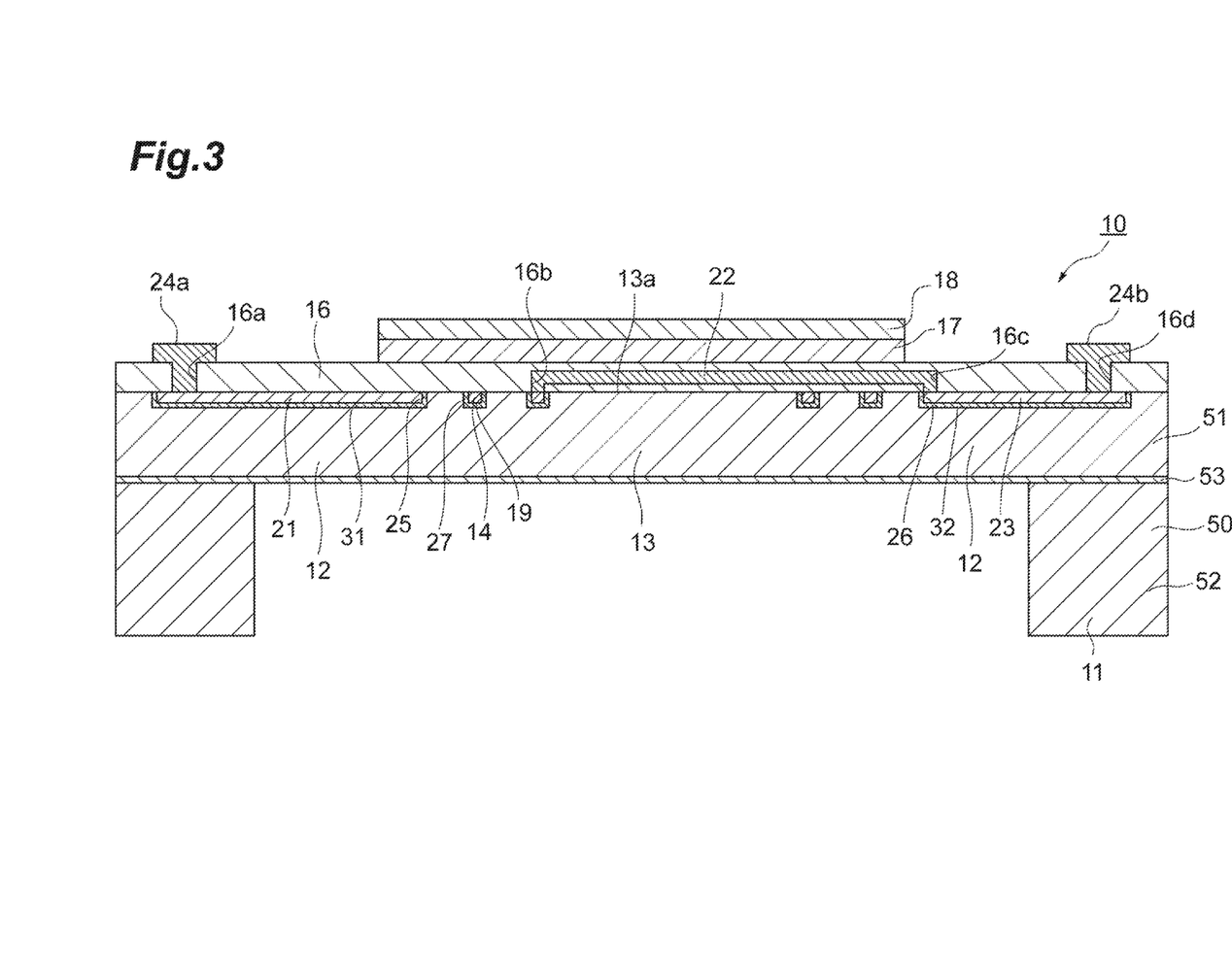
FIG. 3 is a cross-sectional view taken along a line n-III of FIG. 2.

The support portion 11 is a flat plate-shaped frame body having a rectangular shape in the top view (that is, when viewed from a direction perpendicular to a surface 13a of the movable portion 13). The support portion 11 supports the movable portion 13 and others via the pair of connection portions 12. Each connection portion 12 is a flat plate-shaped member having a rectangular shape in the top view and extends along the axis X. Each connection portion 12 connects the movable portion 13 to the support portion 11 on the axis X so that the movable portion 13 is swingable about the axis X.

The movable portion 13 is a flat plate-shaped member having a rectangular shape in the top view and is positioned at the inside of the support portion 11. The movable portion 13 is swingably connected to the support portion 11 as described above. The support portion 11, the connection portion 12, and the movable portion 13 are integrated on a substrate 50.

The substrate 50 is, for example, an SOI substrate and includes silicon (Si) layers 51 and 52 and an insulation layer 53 interposed between the silicon layers 51 and 52. The support portion 11 is formed by the silicon layers 51 and 52 and the insulation layer 53. The connection portion 12 and the movable portion 13 are formed by the silicon layer 51 and the insulation layer 53.

The coil 14 is buried in a groove 19 formed in the surface 13a of the movable portion 13 and is disposed on the surface 13a side of the movable portion 13. The coil 14 is formed of, for example, a metal material such as copper (Cu). The coil 14 is wound a plurality of times in a spiral shape in the top view.

One end of a wire 21 is electrically connected to the outer end of the coil 14. One end of a wire 22 is electrically connected to the inner end of the coil 14. The other end of the wire 21 is electrically connected to an electrode 24a provided with the support portion 11. The other end of the wire 22 is electrically connected to an electrode 24b provided with the support portion 11 via a wire 23.

The wire 21 is buried in a groove 25 formed in the surfaces of the support portion 11, one connection portion 12, and the movable portion 13. The groove 25 is connected to the groove 19 at the connection portion between the coil 14 and the wire 21.

The wire 22 is provided inside the insulation layer 16 and passes over the coil 14 to three-dimensionally intersect the coil 14. The wire 23 is buried in a groove 26 formed in the surfaces of the support portion 11, the other connection portion 12, and the movable portion 13. The electrodes 24a and 24b are electrically connected to a control circuit or the like.

Figure 4:
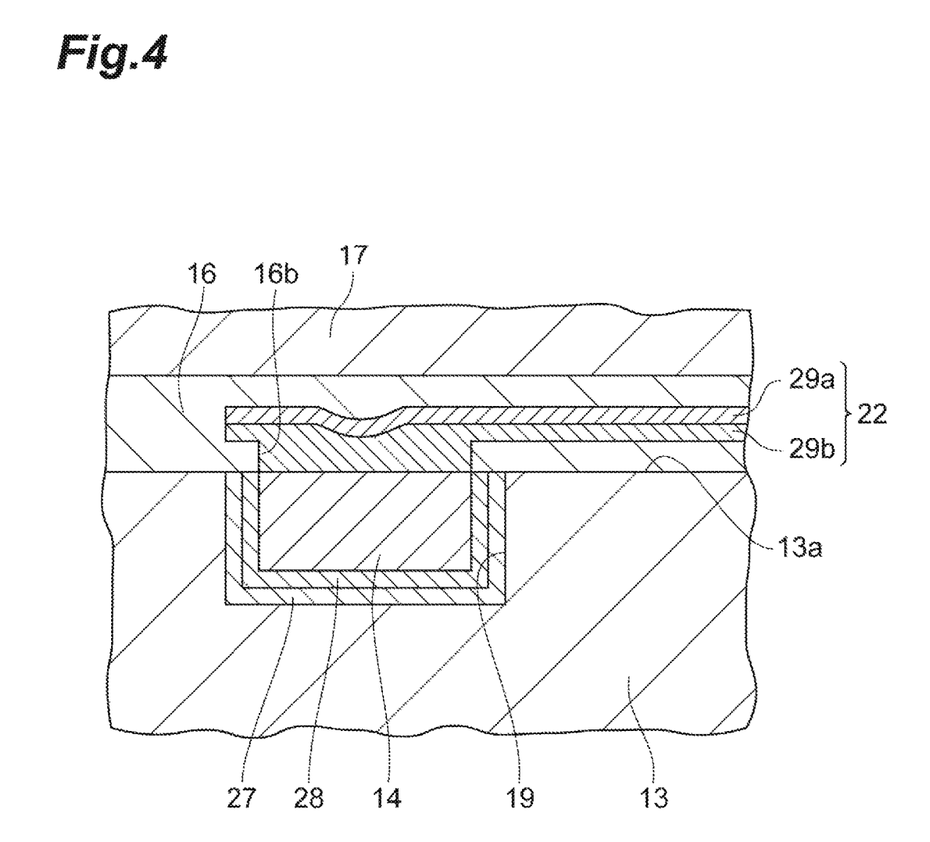
FIG. 4 is a partially enlarged view of FIG. 3.

FIG. 4 is a cross-sectional view showing a connection position between the coil 14 and the wire 22. As shown in FIG. 4, the groove 19 is formed to have, for example, a rectangular cross-sectional shape and the width of the groove 19 is larger than the depth of the groove 19. That is, the width of the coil 14 is larger than the thickness (depth) of the coil 14. The inner surface of the groove 19 is provided with an insulation layer 27. The insulation layer 27 is, for example, a silicon oxide ($SiO_2$) film. A seed layer 28 is provided on the insulation layer 27 inside the groove 19. The seed layer 28 is, for example, a laminated body formed of titanium (Ti) and copper (Cu) and is formed by sequentially sputtering titanium and copper.

The coil 14 is formed by plating copper on the seed layer 28. The coil 14 is buried in the groove 19 via the insulation layer 27 and the seed layer 28. For example, the width of the coil 14 is about 35 μm and the depth of the coil 14 is about 12 μm. The thickness of the coil 14 may be, for example, equal to or larger than ⅓ and equal to or smaller than ½ of the width of the coil 14. In this case, it is possible to reduce the wire resistance by ensuring the volume of the coil 14 while suppressing an increase in thickness of the entire movable portion 13 due to an increase in thickness of the coil 14.

The wires 21 and 23 are formed similarly to the coil 14. The wires 21 and 23 are formed of, for example, copper and are disposed inside the grooves 25 and 26 via the insulation layers 31 and 32 and the seed layer (FIG. 3). The wire 22 includes, for example, a first metal layer 29a formed of gold (Au) and a second metal layer 29b formed of titanium. In the wire 22, the first metal layer 29a is positioned at the opposite side to the coil 14 and the second metal layer 29b is positioned at the side of the coil 14.

The magnetic field generator 15 applies a magnetic field to the coil 14. The magnetic field generator 15 is formed as, for example, a permanent magnet or the like. The magnetic field generator 15 has, for example, a configuration in which an iron core and a permanent magnet are disposed on a wire substrate formed of a resin. The support portion 11 is disposed on the wire substrate. The pair of connection portions 12 and the movable portion 13 are disposed to be separated from the wire substrate. The magnetic field generator 15 includes a pair of portions 15a and 15b which face a pair of side portions parallel to the axis X in the support portion 11. The arrangement of the magnetic poles in the magnetic field generator 15 is, for example, a Halbach array.

The insulation layer 16 is provided on the surfaces of the support portion 11, the pair of connection portions 12, and the movable portion 13. The insulation layer 16 is, for example, a silicon oxide film. The insulation layer 16 is provided to cover the coil 14 and the wires 21 and 23. The electrodes 24a and 24b are provided on the insulation layer 16 positioned on the support portion 11.

The insulation layer 16 is provided with openings 16a to 16d. The wire 21 and the electrode 24a are electrically connected to each other through the opening 16a. The wire 22 and the coil 14 are electrically connected to each other through the opening 16b. The wire 22 and the wire 23 are electrically connected to each other through the opening 16c. The wire 23 and the electrode 24b are electrically connected to each other through the opening 16d.

The resin layer 17 is provided on the insulation layer 16 positioned on the movable portion 13. The resin layer 17 is disposed on an entire surface of an area overlapping the movable portion 13 when viewed from a direction perpendicular to the surface 13a of the movable portion 13. The resin layer 17 is formed of, for example, an ultraviolet curable resin such as CELVENUS LU1303HA (manufactured by DAICEL). A diffraction grating pattern 35 is formed on the surface opposite to the insulation layer 16 of the resin layer 17.

Figure 5:
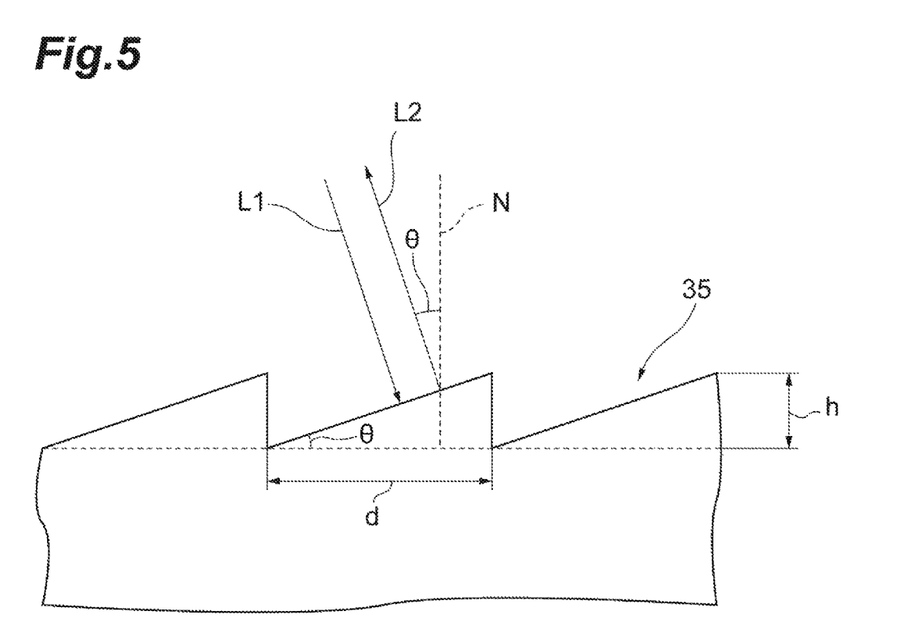
FIG. 5 is a diagram showing a diffraction grating pattern.

FIG. 5 is a diagram showing the diffraction grating pattern 35 when viewed from a direction parallel to the axis X. As shown in FIG. 5, the diffraction grating pattern 35 is a blazed grating pattern having a sawtooth cross section. The diffraction grating pattern 35 is formed by arranging a plurality of grating grooves extending in a direction parallel to the axis X.

In the embodiment, the movable diffraction grating 10 is used as a Littrow type external resonator. In this case, as shown in FIG. 5, diffracted light L2 is reflected in a direction opposite to the incident direction of incident light L1. In the diffraction grating pattern 35, a blazed angle θ which is an angle of a groove with respect to a normal direction N of a lattice surface is expressed by the following equation (1) by using a diffraction order m, a wavelength λ of incident light, and a groove interval d. In the case of the Littrow type, the diffraction order m has a value of 1.

$$\sin \theta = m\lambda/2d \quad (1)$$

As an example, when the oscillation wavelength of the quantum cascade laser element 3 is 4 μm to 16 μm and the groove interval d is 4 μm to 10 μm (that is, the groove density is 100 units/mm to 250 units/mm), the blazed angle θ is 20 degrees to 50 degrees. In this case, the groove depth h is 3 μm to 6 μm.

The reflection layer 18 is provided on the resin layer 17 so as to cover the diffraction grating pattern 35. The reflection layer 18 is disposed on an entire surface of a surface opposite to the insulation layer 16 of the resin layer 17. The reflection layer 18 is formed of, for example, a metal material such as titanium and gold. The reflection layer 18 includes a portion which is formed to follow the shape of the diffraction grating pattern 35. This portion serves as a reflection type grating.

In the movable diffraction grating 10, when a current flows to the coil 14, a Lorentz force is generated in a predetermined direction in the electrons flowing in the coil 14 by the magnetic field generated in the magnetic field generator 15. Accordingly, the coil 14 receives a force in a predetermined direction. For this reason, when the direction or the magnitude of the current flowing to the coil 14 is controlled, the movable portion 13 can be swung about the axis X. Further, when a current of a frequency corresponding to the resonance frequency of the movable portion 13 flows to the coil 14, the movable portion 13 can be swung at a high speed at a resonance frequency level.

In the above-described movable diffraction grating 10, the coil 14 is buried in the movable portion 13. Accordingly, the movable portion 13 can be decreased in thickness and the movable portion 13 can be swung at a high speed with a large deflection angle. Further, because the coil 14 is buried in the movable portion 13, it is possible to ensure the thickness of the coil 14 compared to, for example, a case where the coil 14 is provided on the movable portion 13 and thus to reduce the resistance of the coil 14. Because the heating of the coil 14 is suppressed when the resistance of the coil 14 decreases, it is possible to suppress the deformation of the reflection layer 18 due to the heat from the coil 14. Further, in the movable diffraction grating 10, the resin layer 17 is provided with the diffraction grating pattern 35 and the reflection layer 18 formed of a metal is provided on the resin layer 17 to follow the diffraction grating pattern. Accordingly, because the resin layer 17 is disposed between the coil 14 and the reflection layer 18, it is possible to suppress the transfer of the heat from the coil 14 to the reflection layer 18 and to promote the radiation of the heat from the surface opposite to the reflection layer 18 in the movable portion 13. As a result, it is possible to further suppress the deformation of the reflection layer 18 due to the heat transferred from the coil 14. Thus, according to the movable diffraction grating 10, it is possible to swing the movable portion 13 at a high speed with a large deflection angle and to suppress degradation in optical characteristic due to a thermal deformation.

Further, in the movable diffraction grating 10, the coil 14 is disposed inside the groove 19 formed in the surface 13a of the movable portion 13. Accordingly, it is possible to further decrease the thickness of the movable portion 13 and to swing the movable portion 13 at a higher speed with a larger deflection angle. That is, for example, when the coil 14 is provided in the surface facing the surface 13a of the movable portion 13, the movable portion 13 becomes as thick as the support portion 11 due to the restriction on processing. In contrast, because the coil 14 is disposed in the surface 13a of the movable portion 13 in the movable diffraction grating 10, it is possible to further decrease the thickness of the movable portion 13 and to swing the movable portion 13 at a higher speed with a larger deflection angle.

Further, in the movable diffraction grating 10, the diffraction grating pattern 35 is disposed in an area overlapping the coil 14 when viewed from a direction perpendicular to the surface of the movable portion 13. Accordingly, it is possible to swing the movable portion at a high speed with a large deflection angle by suppressing an increase in size of the movable portion 13 while ensuring the area of the diffraction grating pattern 35.

Further, in the movable diffraction grating 10, the diffraction grating pattern 35 is a blazed grating pattern that diffracts light having a wavelength in a mid-infrared region. Accordingly, a high diffraction efficiency can be obtained.

Further, because the grooves of the blazed grating for the wavelength in the mid-infrared region are deeper than those for the wavelength shorter than in the mid-infrared region, it is possible to reduce an influence on the diffraction efficiency from the deformation of the reflection layer 18.

Further, in the movable diffraction grating 10, the resin layer 17 is formed of UV curable resin. For this reason, it is possible to further suppress the transfer of the heat from the coil 14 to the reflection layer 18 and to further promote the radiation of the surface opposite to the reflection layer 18 in the movable portion 13 compared to, for example, a case where the resin layer 17 is formed of a thermosetting resin. Further, because the resin layer 17 is not easily aged and is excellent in durability, the reliability of the movable diffraction grating 10 is improved.

Further, in the external resonator type laser module 1 including the movable diffraction grating 10, because the movable diffraction grating 10 serves as the external resonator, light having a specific wavelength can be amplified and output to the outside. Further, because the direction of the lattice surface is changed by the swing of the movable portion 13 of the movable diffraction grating 10, the wavelength of the output light can be changed at a high speed. For that reason, for example, when the external resonator type laser module 1 is used as a light source for gas concentration measurement, one light source can measure various gases and the measurement time can be shortened.

Figure 6:
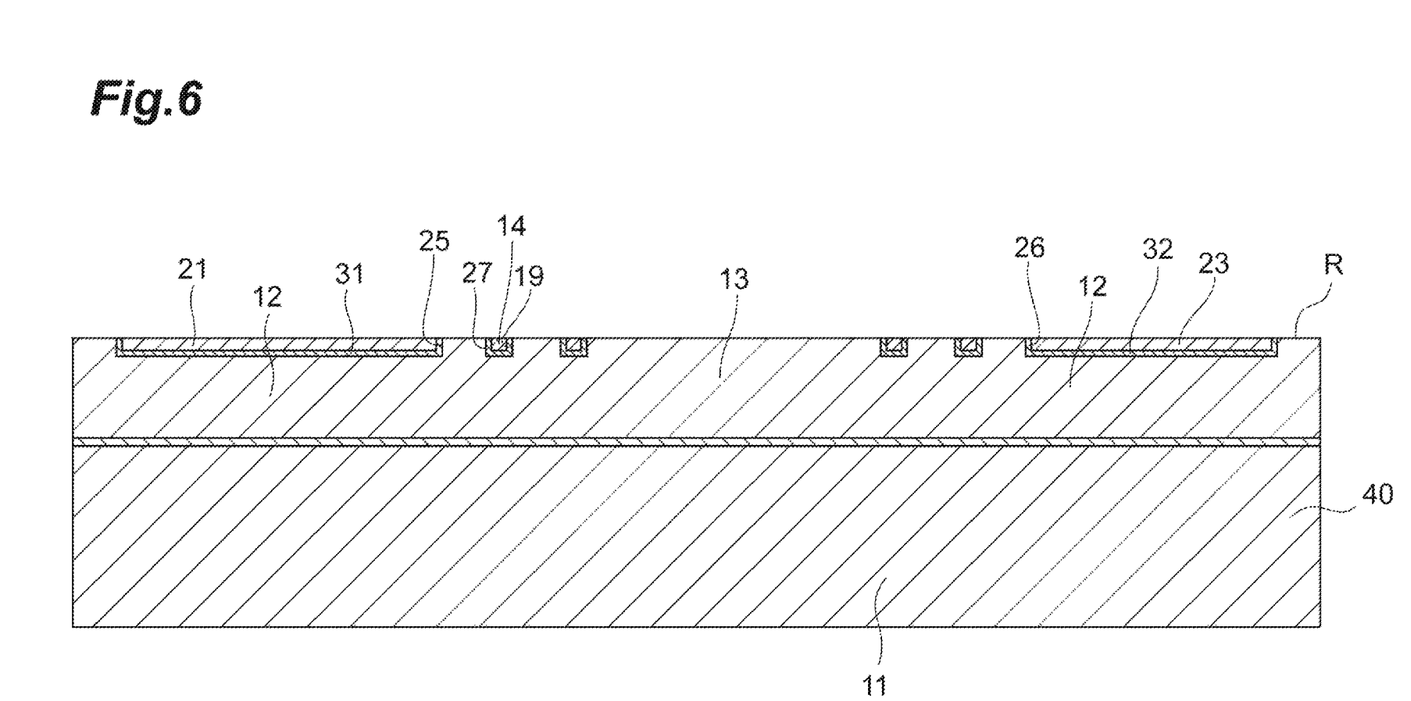
FIG. 6 is a diagram showing a method of manufacturing the movable diffraction grating of FIG. 2.

Next, an example of a method of manufacturing the movable diffraction grating 10 will be described with reference to FIGS. 6 to 8. First, as shown in FIG. 6, a wafer 40 including portions R corresponding to the support portion 11, the pair of connection portions 12, and the movable portion 13 is prepared and the coil 14 is formed to be buried in the movable portion 13 (a first step). The wafer 40 is, for example, an SOI substrate and includes the plurality of portions R which are disposed to be adjacent to each other. In this case, the processing steps to be described below are performed at the same time for the portions R. At the time of performing through etching for separating the movable portion 13 from the periphery, etching is simultaneously performed along a boundary (dicing line) between the portions R and thus the substrate 50 separated from the wafer 40 is obtained. In the description below, a description will be made by focusing on one portion R.

In the first step, the grooves 19, 25, and 26 are first formed in the surfaces of the portions R by etching. Subsequently, a thermal oxidation treatment is performed on the inner surfaces of the grooves 19, 25, and 26 so that the insulation layers 27, 31, and 32 are formed on the inner surfaces of the grooves 19, 25, and 26. Subsequently, the seed layer is formed on the insulation layers 27, 31, and 32 inside the grooves 19, 25, and 26 by sputtering. Subsequently, the coil 14 and the wires 21 and 23 are formed to be buried in the grooves 19, 25, and 26 by plating. Subsequently, the seed layer is exposed by CMP (Chemical Mechanical Polishing). Next, the seed layer is removed by etching so that the surfaces of the coil 14 and the wires 21 and 23 are flattened to be blush with the surface of the wafer 40.

Figure 7:
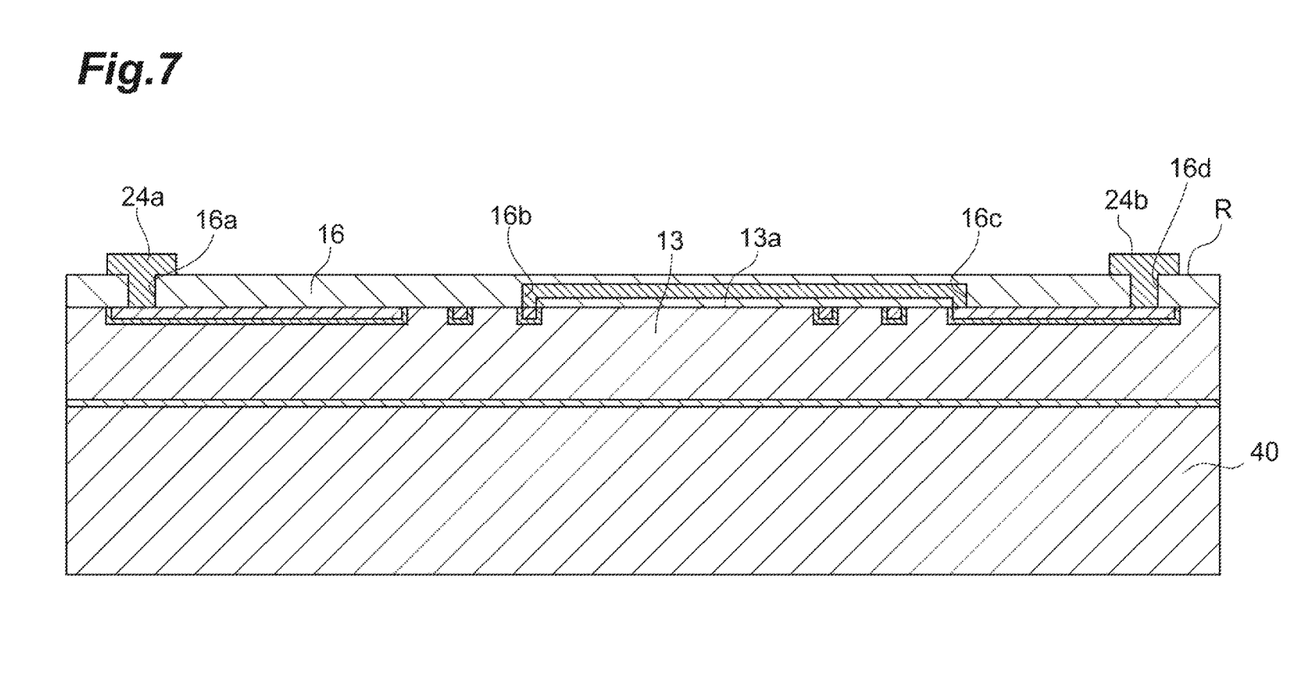
FIG. 7 is a diagram showing a method of manufacturing the movable diffraction grating of FIG. 2.
Figure 8:
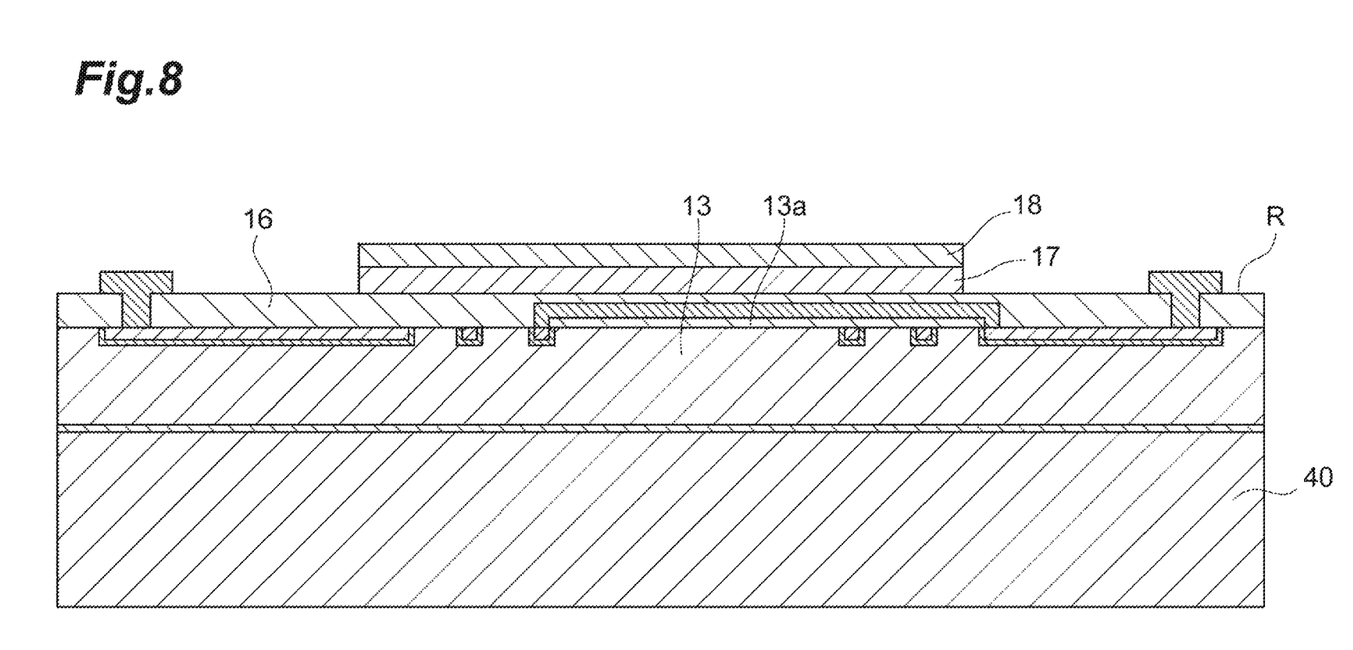
FIG. 8 is a diagram showing a method of manufacturing the movable diffraction grating of FIG. 2.

Subsequently, as shown in FIG. 7, the insulation layer 16 is formed on the surface 13a of the movable portion 13 (a second step). In the second step, a part of the insulation layer 16 in the thickness direction is first formed on the surfaces of the support portion 11, the pair of connection portions 12, and the movable portion 13 by CVD (Chemical Vapor Deposition). Subsequently, contact holes corresponding to the openings 16a to 16d are formed in a part of the insulation layer 16 by etching. Subsequently, the wire 22 is formed on a part of the insulation layer 16 by sputtering. Subsequently, a remaining portion of the insulation layer 16 is formed on a part of the insulation layer 16 by CVD. Subsequently, contact holes corresponding to the openings 16a and 16d are formed in the insulation layer 16 by etching. Subsequently, the electrodes 24a and 24b are formed on the insulation layer 16 by sputtering.

Subsequently, a resin material having a UV curable property is disposed on the insulation layer 16 (a third step). In the third step, a layer of a resin material is uniformly formed on an area including the surface 13a of the movable portion 13 on the surface of the insulation layer 16 by spin coating. That is, the resin material has a portion which is positioned at the outside of the surface 13a of the movable portion 13 in the top view at this time point.

Subsequently, the resin layer 17 provided with the diffraction grating pattern 35 is formed by transferring a transfer pattern to the resin material using the mold having the transfer pattern corresponding to the diffraction grating pattern 35 (a fourth step, FIG. 8). In the fourth step, for example, UV rays are irradiated to the resin material through the mold while the mold having ultraviolet transmittance contacts the resin material so that the diffraction grating pattern 35 is formed in the resin material. This mold is manufactured by, for example, the following steps. First, the diffraction grating pattern 35 is formed in a silicon substrate including a surface (311) by anisotropic etching to prepare a master. Subsequently, a mold formed of UV transmitting resin and having a transfer pattern corresponding to the diffraction grating pattern 35 is copied by using the master. By these steps, the mold is obtained.

After the fourth step, the reflection layer 18 is formed on the resin layer 17 to follow the diffraction grating pattern 35 by, for example, sputtering or depositing (a fifth step). Subsequently, the resin material is patterned by etching so that a portion positioned at the outside of the surface 13a of the movable portion 13 (a portion other than the resin layer 17) in the top view of the resin material is removed. Subsequently, a portion other than the portions R corresponding to the support portion 11, the pair of connection portions 12, and the movable portion 13 in the wafer 40 is removed by etching. At the same time, through etching is performed on the dicing line to obtain the movable diffraction grating 10.

In the method of manufacturing the movable diffraction grating 10, the highly precise diffraction grating pattern 35 can be easily formed. That is, for example, the diffraction grating pattern 35 may be formed on the insulation layer 16, but it is extremely difficult to form a pattern of µm order like the diffraction grating pattern 35 on the insulation layer 16 formed as a silicon oxide film. Further, it is also difficult to precisely form a silicon oxide film with a thickness of several µm. These are outstanding in case the diffraction grating pattern 35 diffracts light having a wavelength in the mid-infrared region and the groove of the diffraction grating pattern 35 is deep as in the embodiment. In contrast, in the method of manufacturing the movable diffraction grating 10, a transfer pattern is transferred to the resin material by using the mold having the transfer pattern corresponding to the diffraction grating pattern 35 to form the resin layer 17 provided with the diffraction grating pattern 35. For this reason, it is possible to easily form the highly precise diffraction grating pattern 35.

While the embodiment of the invention has been described, the invention is not limited to the above-described embodiment. For example, the coil 14 may be provided on the surface facing the surface 13a of the movable portion 13. The diffraction grating pattern 35 may be disposed at the inside of the coil 14 when viewed from a direction perpendicular to the surface of the movable portion 13. The diffraction grating pattern 35 does not necessarily have to diffract light having a wavelength in the mid-infrared region and may diffract light of any wavelength. The diffraction grating pattern 35 may be a binary grating having a rectangular cross-section, a holographic grating having a sinusoidal cross-section, or the like. The movable portion 13 may have a circular shape in the top view.

According to an aspect of the invention, it is possible to provide a movable diffraction grating capable of swinging a movable portion at a high speed with a large deflection angle and suppressing degradation in optical characteristic due to a thermal deformation, a method of manufacturing the same, and an external resonator type laser module including such a movable diffraction grating.

What is claimed is:

1. A movable diffraction grating comprising:
   a support portion;
   a movable portion swingably connected to the support portion;
   a coil buried in the movable portion;
   a magnetic field generator configured to apply a magnetic field to the coil;
   an insulation layer provided on a surface of the movable portion;
   a resin layer provided on the insulation layer and provided with a diffraction grating pattern; and
   a reflection layer formed of a metal and provided on the resin layer to follow the diffraction grating pattern,
   wherein the coil is disposed inside a groove formed in the surface of the movable portion, and
   wherein a width of the coil is larger than a thickness of the cod.

2. The movable diffraction grating according to claim 1, wherein the diffraction grating pattern is disposed in an area overlapping the coil when viewed in a direction perpendicular to the surface of the movable portion.

3. The movable diffraction grating according to claim 1, wherein the diffraction grating pattern is a blazed grating pattern diffracting light having a wavelength in a mid-infrared region.

4. A method of manufacturing the movable diffraction grating according to claim 1, comprising:
   a first step of preparing a substrate including a portion corresponding to the support portion and the movable portion and forming the coil to be buried in the movable portion;
   a second step of forming the insulation layer on the surface of the movable portion after the first step;
   a third step of disposing, a resin material on the insulation layer after the second step;
   a fourth step of forming the resin layer provided with the diffraction grating pattern by transferring a transfer pattern corresponding to the diffraction grating pattern to the resin material using a mold having the transfer pattern after the third step;
   a fifth step of forming the reflection layer on the resin layer to follow the diffraction grating pattern after the fourth step; and
   a sixth step of removing a portion other than the portion corresponding to the support portion and the movable portion in the substrate after the fifth step.

5. An external resonator type laser module comprising:
   the movable diffraction grating according to claim 1; and
   a quantum cascade laser element, wherein the movable diffraction grating diffracts and reflects light oscillated by the quantum cascade laser element so that light having a specific wavelength is returned to the quantum cascade laser element.

* * * * *